United States Patent [19]

Harrand et al.

[11] Patent Number: 5,592,428
[45] Date of Patent: Jan. 7, 1997

[54] DYNAMIC MEMORY

[75] Inventors: Michel Harrand, Saint Egreve; Michel Runtz, Grenoble, both of France

[73] Assignee: SGS-Thomson Microelectronics S.A., Saint Genis Pouilly, France

[21] Appl. No.: 240,144

[22] Filed: May 10, 1994

[30] Foreign Application Priority Data

May 24, 1993 [FR] France .................................. 93 06533

[51] Int. Cl.$^6$ ..................................................... G11C 7/02
[52] U.S. Cl. ..................... 365/210; 365/149; 365/189.07; 365/203
[58] Field of Search ............................. 365/210, 189.07, 365/149, 203, 207, 189.09, 189.01

[56] References Cited

U.S. PATENT DOCUMENTS

| | | | |
|---|---|---|---|
| 4,363,111 | 12/1982 | Heightley et al. | 365/210 |
| 4,484,312 | 11/1984 | Nakano et al. | 365/210 |
| 4,547,868 | 10/1985 | Childers et al. | 365/210 X |
| 4,633,443 | 12/1986 | Childers | 365/210 X |
| 4,831,591 | 5/1989 | Imazeki et al. | 365/210 X |
| 4,961,166 | 10/1990 | Sato et al. | 365/189.01 |
| 5,351,210 | 9/1994 | Saito | 365/210 X |

*Primary Examiner*—David C. Nelms
*Assistant Examiner*—Huan Hoang
*Attorney, Agent, or Firm*—David M. Driscoll; James H. Morris; Brett N. Dorny

[57] ABSTRACT

A dynamic memory includes a plurality of cells including capacitors connected by columns to bit lines and by rows to selection lines. An even row and an odd row contain reference cells, the cells of the other rows being memory cells. The capacitors of the reference cells have the same value as the capacitors of the memory cells. Means are also provided for, prior to reading a memory cell of an even row, connecting the selection line of the odd row of reference cells to an element having the same capacitance as a selection line, but which is precharged at the state opposite to the state of the selection line of the odd row of the reference cells.

23 Claims, 3 Drawing Sheets

5,592,428

DYNAMIC MEMORY

BACKGROUND OF THE INVENTION

1. Field of the Invention

The present invention relates to dynamic memories, and more particularly to dynamic memories including dummy or reference cells.

2. Discussion of the Related Art

FIG. 1 partially represents such a dynamic memory that includes a plurality of memory cells, each including an N-channel MOS transistor MN or MN' to connect a capacitor C between a reference potential, such as ground, to a bit line BL or BL'. The cells are disposed in columns, corresponding to the bit lines BL and BL', and in rows. The columns are grouped by pair. Hereinafter, an "even" element is an element associated with any column of a pair, and an "odd" element is an element associated with the other column of the pair.

An even row of cells includes cells MN/C that are connected only to the even bit lines BL. An odd row of cells includes cells MN'/C that are connected only to the odd bit lines BL'. The gates of transistors MN or MN' of a row are connected to a selection line RW or RW', respectively.

The lines BL and BL' of a pair of columns are connected to a high voltage Vdd through P-channel MOS transistors, MP1 and MP1', respectively, and to ground through N-channel MOS transistors, MN1 and MN1', respectively. The gates of transistors MP1 and MP1' are connected to a precharge line P, and the gates of transistors MN1 and MN1' are connected to a write line W. Each pair of columns is associated with specific lines P and W to select the pair of columns. Additionally, each pair of lines BL and BL' is connected to the input of a comparator 70.

In the rectangle 72 drawn in dotted lines are represented so-called dummy or reference even and odd rows of cells. These reference cells are identical to the preceding cells, except that their capacitance, C/2, has half the value of capacitors C. The transistors of the even row of reference cells are labeled MND, and their gates are connected to a selection line RWD. The transistors of the odd row of reference cells are labeled MND', and their gates are connected to a selection line RWD'.

To write a "0" in a cell, the corresponding line RW or RW' and line W of the corresponding column pair are activated. Lines BL and BL' go to 0 and the capacitor C of the enabled cell is discharged.

To write a "1" in a cell, the corresponding line RW or RW' and the line P of the corresponding column pair are activated. The voltage on lines BL and BL' goes to Vdd and the capacitor C of the enabled cells is charged at voltage Vdd, at approximately the threshold voltage of transistors MN or MN'.

Prior to reading a cell, capacitors C/2 of the reference cells are discharged. This can be achieved by writing a series of "0" in these cells. Then, to read the memory cell, for example an even cell, lines BL and BL' of the corresponding pair of columns are first precharged at voltage Vdd by activating the associated line P. Lines BL and BL' have high value capacitors that are thus charged at voltage Vdd. Then, the selection line RW of the even row including the even cell to be read is activated simultaneously with selection line RWD' of the odd reference cells. Thus, a capacitor C is connected to line BL, and a capacitor C/2 is connected to line BL'. Since capacitor C/2 was previously discharged, a charge is transferred from line BL' to the reference capacitor C/2. The capacitance of line BL' has a high value as compared with the value of capacitor C/2, and the voltage on this line drops by approximately 100 mV only.

If the capacitor C of the cell to be read is charged, that is, if the cell is at "1", the state of line BL does not change. Thus, the voltage on line BL' is lower than the voltage on line BL, and comparator 10 switches to a first state indicating that the cell that is read is at "1".

If the capacitor C of the read cell is discharged (the cell is at "0"), a charge is also transferred from line BL to capacitor C. Since the value of capacitor C is twice the value of capacitor C/2 of the reference cell, the voltage drop on line BL is twice as high as that on line BL'. Thus, the voltage on line BL becomes lower than the voltage on line BL' and comparator 10 switches to a second state indicating that the cell that is read is at "0".

One of the difficulties for the manufacturing of such a dynamic memory lies in the implementation of a sufficiently precise ratio between capacitors C and capacitors C/2. In technologies intended to fabricate dynamic memories only, studies and tests have overcome this difficulty by establishing design rules for the capacitors C and C/2. However, when these rules are applied to distinct technologies, unlike results are obtained, to such an extent that capacitors C and C/2 may have close values. This situation is particularly impairing if it is desired to include dynamic memories in various circuits, that are not exclusively intended to serve as memories, such as circuits for the processing of signals, since these various circuits can be fabricated in a plurality of distinct technologies to which the same design rules of capacitors cannot be applied.

SUMMARY OF THE INVENTION

An object of the invention is to provide a dynamic memory including reference cells, whose structure can be used, without adaptation, in any technology.

These and other objects are achieved by replacing the capacitors of the reference cells with capacitors having the same value as the capacitors of the memory cells and by charging these reference capacitors, before a read operation, at a voltage close to half the supply voltage. The invention more particularly provides specific means for charging the reference capacitors at the desired value.

The present invention more particularly provides a dynamic memory including: a plurality of cells including capacitors connected by columns to bit lines and by rows to selection lines, an even column of each pair of columns containing cells of respective even rows, and an odd column of each pair of columns containing cells of respective odd rows; an even row and an odd row containing reference cells, the cells of the other rows being memory cells; means for precharging the bit lines at a predetermined state before reading; means for selecting, when reading, the odd row of the reference cells simultaneously with any one of the even rows of the memory cells; and a comparator associated with each pair of columns, receiving the two bit lines of the pair of columns. According to the invention, the capacitors of the reference cells have the same value as the capacitors of the memory cells; means are also provided for, prior to reading a memory cell of an even row, connecting the selection line of the odd row of reference cells to an element having the same capacitance as a selection line, but which is precharged at the state opposite to the state of the selection line of the odd row of the reference cells.

According to an embodiment of the invention, said element is a dummy selection line having the same characteristics as the other selection lines.

According to an embodiment of the invention, the memory includes two first transistors to connect respectively the selection lines of the reference cells to the dummy selection line, and means to control either one of these first transistors when the bit lines are precharged.

According to an embodiment of the invention, the memory includes second transistors to initialize the capacitors of the reference cells, and means to control the second transistors of the odd row of reference cells once an arbitrary even row of memory cells has been selected.

According to an embodiment of the invention, the memory includes, for each selection line of the reference cells, third and fourth transistors to respectively restore this selection line to an active or an inactive state, and means to control the third transistor of the odd row when an even row of memory cell is selected, and to control the fourth transistor of the odd row once the even row of the memory cells has been selected.

According to an embodiment of the invention, the memory includes a fifth transistor to restore the dummy selection line to an active state, and means to control this fifth transistor when an arbitrary row is selected.

The foregoing and other objects, features, aspects and advantages of the invention will become apparent from the following detailed description of the present invention when taken in conjunction with the accompanying drawings.

DETAILED DESCRIPTION

Figure 1:
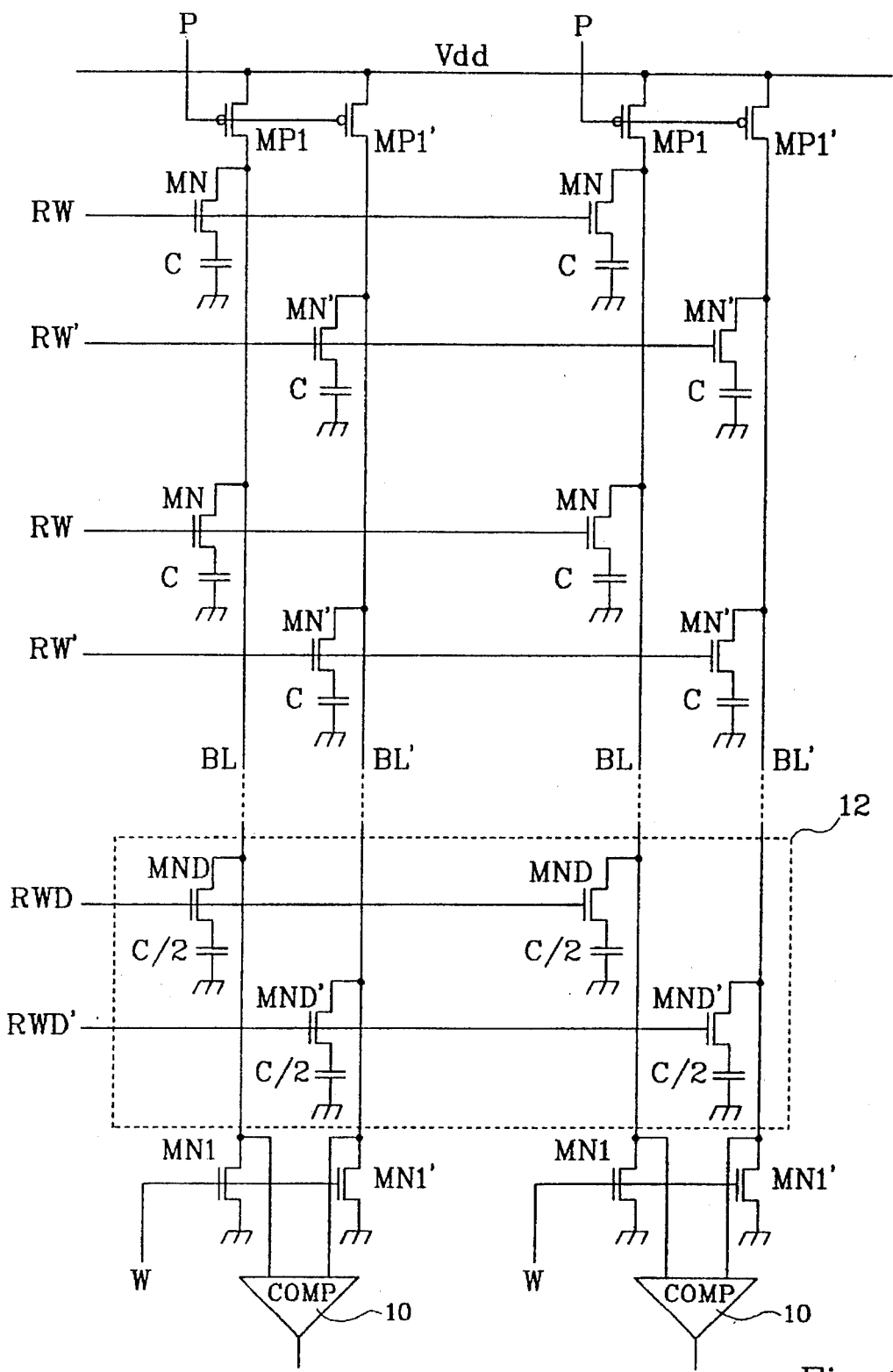
FIG. 1, above described, partially represents a structure of a conventional dynamic memory.

FIG. 2 shows again some of the components of FIG. 1, that are labeled with the same reference characters. According to the invention, in each reference cell, surrounded by a square 20 drawn in dotted lines, capacitor C/2 is replaced with a capacitor C having the same value as the capacitors of the other memory cells. One can very easily implement in an integrated circuit capacitors having identical values. Generally, it is merely sufficient that the capacitors have the same shape and the same size.

With the two selection lines RWD and RWD' of the reference cells is associated a dummy selection line REF that has the same capacitive characteristics as lines RWD and RWD'. For this purpose, line REF is connected to the gates of the unused transistors MR that are identical to transistors MND and MND'. A transistor MR is provided on line REF for each pair of columns. The drain and source of transistors MR are grounded.

To charge the capacitors of the reference cells at a value Vdd/2, the invention provides for previously discharging them, then charging line REF at voltage Vdd, and then connecting this line REF to line RWD or RWD', which is charged at potential 0. The charges get balanced between lines REF and RWD or RWD' and, since they have the same capacitance, their respective voltages are set to Vdd/2. Transistors MND and MND' are connected as transistor followers and their gate voltage Vdd/2 is applied onto their capacities C, disregarding the threshold voltage of transistors MND and MND'.

Voltage Vdd/2 could be applied to the gate of transistors MND or MND' through a resistor bridge. However, a resistor is cumbersome and difficult to implement in MOS technology, which is the technology used for dynamic memories. Additionally, such a resistor bridge would consume an undetermined quiescent current that is variable for various circuits. In CMOS technology, it is desired to avoid consumption of quiescent current since one of the means to sense a defective CMOS circuit is to detect whether it consumes current in the quiescent state.

The reference cells further include transistors (labeled MC for the even reference cells and MC' for the odd reference cells) connected in parallel with capacitors C. The gates of transistors MC are controlled through clear lines CLR, and the gates of transistors MC' are controlled through a clear line CLR'. Of course, transistors MC and MC' must not affect the value of capacitors C that they control. For this purpose, transistors MN and MC (or MN' and MC') of a reference cell are disposed on both sides of the electrodes of capacitor C, along the electrode plane.

Figure 2:
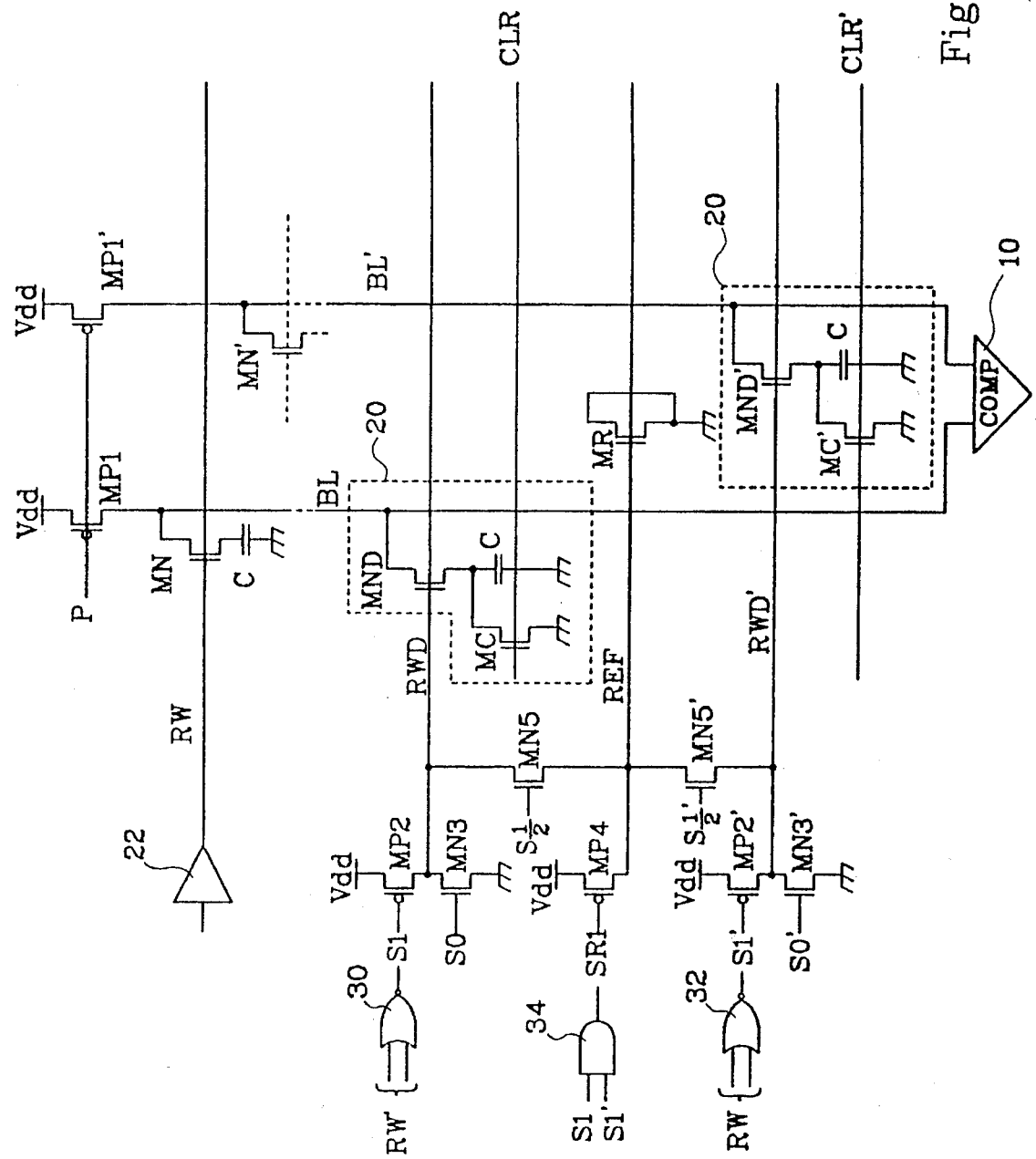
FIG. 2 partially represents a structure of an embodiment of a dynamic memory according to the invention.

FIG. 2 also represents components for controlling the various selection lines. The selection lines RW and RW' are conventionally controlled through a transistor follower 22, in turn controlled through a conventional decoding circuit (not shown). Line RWD is connected to voltage Vdd through a transistor MP2 and to ground through a transistor MN3. The gates of transistors MP2 and MN3 are controlled by lines S1 and S0, respectively. Similarly, line RWD' is connected to the high voltage Vdd through a transistor MP2' and to a low voltage through a transistor MN3'. The gates of transistors MP2' and MN3' are controlled by lines S1' and S0', respectively. The dummy selection line REF is connected to the high voltage Vdd through a transistor MP4 having its gate controlled by a line SR1. A transistor MN5 interconnects lines RWD and REF, and a transistor MN5' interconnects lines RWD' and REF. The gates of transistors MN5 and MN5' are controlled by lines $S_{1/2+cc}$ and $S_{+c,fra\ 1/2}'$.

Figure 3:
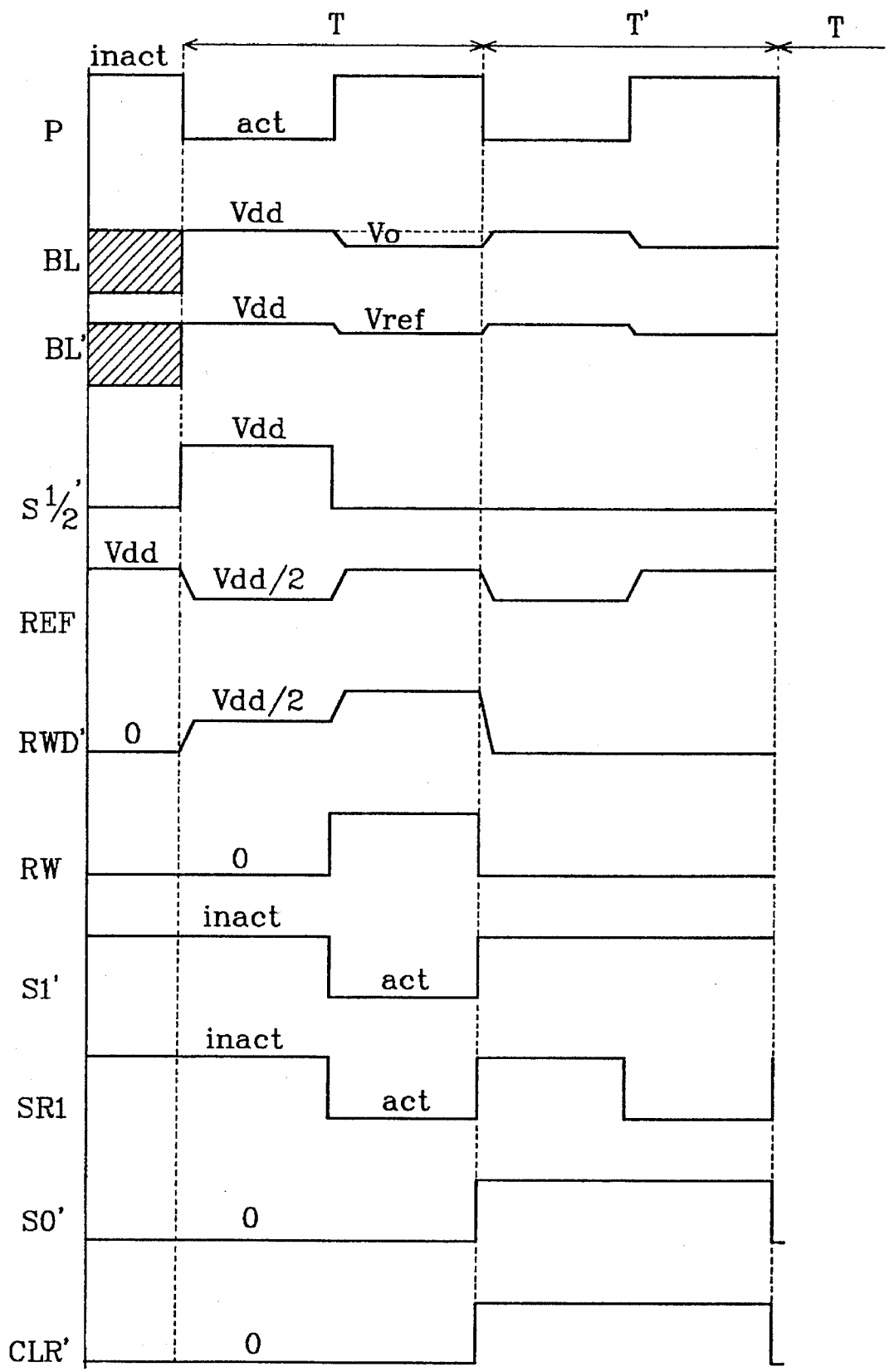
FIG. 3 is a timing diagram of read cycles of cells in a dynamic memory according to the invention.

FIG. 3 represents the states of the various lines of the circuit of FIG. 2 during two successive read cycles occurring during respective time intervals T T'. Interval T corresponds to a read cycle of an even cell, and interval T' corresponds to a read cycle of an odd cell.

According to an embodiment of the invention, data in a dynamic memory provided with reference cells are read by alternatively reading even cells and odd cells. A read cycle is partitioned into a precharging step of bit lines BL and BL', and into an actual read step.

During the precharging cycle, at the beginning of interval T, line P is set to an active level ("0"). As a result, the bit lines BL and BL' are charged at voltage Vdd (the initial state of lines BL and BL' is arbitrary).

During this precharging phase, line $S_{1/2}'$ is also activated, which interconnects the dummy selection line REF and the selection line RWD'. Initially, line REF was at voltage Vdd and line RWD' was at voltage 0, in which both were floating. As a result, during this precharging phase, the voltage of line REF drops to Vdd/2 while the voltage of the selection line RWD' increases up to Vdd/2, because these two lines have the same capacitance. Since the transistors of the reference cells are disposed as transistor followers, capacitor C of the selected odd reference cell charges at Vdd/2, disregarding the threshold voltage of transistor MND'.

Then, the read phase starts with the deactivation of the precharging line P and activation of the selection line RW of the even row including the cell to be read. Simultaneously as line RW is activated, line S1' is also activated, which causes line RWD' to go to voltage Vdd. The capacitor C of the cell to be read is connected to line BL, and the capacitor C of the reference cell is connected to line BL'; lines BL and BL' are floating but were previously charged at voltage Vdd during the precharging phase.

If the capacitor C of the even cell to be read was already charged at Vdd (the cell was at "1"), the voltage on line BL does not vary, as represented in dotted lines. In contrast, if capacitor C was discharged, the charges are balanced between capacitor C and line BL, and the voltage on line BL drops down to a voltage V0 that is lower by a few hundred mV than voltage Vdd.

Simultaneously, the charges of line BL' and of capacitor C of the odd reference cell are balanced. However, since the voltage across the capacitor of the reference cell was substantially at Vdd/2, the voltage on line BL' drops down to a voltage Vref substantially at half way between voltage Vdd and voltage V0.

The comparator 10, that receives lines BL and BL', switches to a first state if the read cell was at "1", since, then, the voltage on line BL was higher than voltage Vref, or switches to a second state if the read cell was at "0", since, then, the voltage on line BL was lower than voltage Vref.

During the read phase, line SR1 is also activated, which restores the initial state of the dummy selection line REF to voltage Vdd. Signal SR1 is activated at each read phase, during the read phase of an even cell or of an odd cell.

A read cycle T' of an odd cell, which is for example in the same pair of columns as the even cell that has just been read, starts upon the end of cycle T. Signals P, BL, BL', REF and SR1 are similar to the signals of the preceding cycle T.

During cycle T' signals $S_{1/2}'$, RWD', RW and S1' remain inactive; and signals $S_{1/2}$, RWD, RW' and S1 (not shown), respectively, similarly operate.

At the end of each read cycle, for example of cycle T, line RWD' must be restored to its inactive state "0"by activating signal S0' during the next cycle T'. Additionally, still for cycle T, the capacitor C of the reference cell that has just been used must be discharged by activating the clear line CLR' during the next cycle T'.

The clearing transistors MC are particularly useful since these transistors discharge the capacitors C of the reference cells, for example of the even cells, while the odd reference cells are used to read the even memory cells. This allows the chaining of two read cycles without any latency time. The clearing transistors can be omitted, but, then, the capacitors of the reference cells must be discharged by writing a "0" in these cells, which is a loss of time.

The fabrication of a decoder to provide the control signals of the reference cells according to the invention will clearly appear to those skilled in the art. For example, as represented in FIG. 2, signal S1 is obtained with a NOR gate 30 combining all signals RW'; signal S1' is obtained with a NOR gate 32 combining all signals RW; and signal SR1 is obtained with an AND gate 34 combining signals S1 and S1'. Signals $S_{1/2+ce}$ and $S_{+e,fra\ 1/2}'$ are obtained by combining the precharging signal P and a signal (not described) conventionally serving to indicate whether even cells or odd cells are read. Signals S0' and CLR' can equal the signal serving to indicate an even or odd read phase, or can be obtained by halving the frequency of signal SR1.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A dynamic memory comprising:

a plurality of cells, each cell including a capacitor connected by a column to a bit line and by a row to a selection line, the plurality of cells grouped into a plurality of pairs, each pair having an even column containing a cell of a respective even row, and an odd column containing a cell of a respective odd row;

an even row and odd row containing reference cells, the cells of the other rows being memory cells;

means for precharging each bit line at a predetermined state before reading;

means for selecting, when reading, the odd row of each reference cell simultaneously with one of the even rows of the memory cells; and a comparator associated with each pair of columns, receiving the two bit lines of the pair of columns;

wherein the capacitor of each reference cell has a capacitance value and the capacitor of each memory cell has a capacitance value substantially equal to the capacitance value of the capacitor of each reference cell; and wherein means are provided for, prior to reading a memory cell of an even row, connecting a selection line of the odd row of reference cells to a capacitance element that is precharged at the state opposite to the state of the selection line of the odd row of reference cells, the selection line of the odd row of reference cells and the capacitance element each having a substantially equal capacitance.

2. The dynamic memory of claim 1, further including a plurality of transistors to initialize the capacitors of the reference cells, and means to control the transistors of the odd row of reference cells once an arbitrary even row of memory cells has been selected.

3. The dynamic memory of claim 1, further including, for each selection line of the reference cells, two transistors to respectively restore said selection line to an active state and an inactive state, and means to control one of the two transistors of the odd row when an even row of memory cells is selected, and to control another one of the two transistors of the odd row once the even row of the memory cells has been selected.

4. The dynamic memory of claim 1, wherein said element is a dummy selection line having the same characteristics as the other selection lines.

5. The dynamic memory of claim 4; further including two transistors to connect respectively the selection lines of the reference cells to the dummy selection line, and means to control either one of said transistors when the bit lines are precharged.

6. The dynamic memory of claim 4, further including a transistor to restore the dummy selection line to an active state, and means to control this transistor when an arbitrary row is selected.

7. A dynamic memory device comprising:

a plurality of cells, each cell including a capacitor connected by a column to a bit line and by a row to a selection line, the plurality of cells grouped into a plurality of pairs, each paid having an even column containing a cell of a respective even row, and an odd column containing a cell of a respective odd row;

an even row and odd row containing reference cells, the cells of the other rows being memory cells;

a precharging circuit for precharging each bit line at a predetermined state before reading;

an activation line for selecting, when reading, the odd row of each reference cell simultaneously with one of the even rows of the memory cells; and a comparator associated with each pair of columns, receiving the two bit lines of the pair of columns;

wherein the capacitor of each reference cell has a capacitance value and the capacitor of each memory cell has a capacitance value substantially equal to the capacitance value of the capacitor of each reference cell; and wherein a transistor is provided for, prior to reading a memory cell of an even row, connecting a selection line of the odd row of reference cells to a capacitance element that is precharged at a state opposite to the state of the selection line of the odd row of the reference cells, the selection line of the odd row of the reference cells and the capacitance element each having a substantially equal capacitance.

8. A memory circuit, comprising:

a memory cell having a first capacitance, and that is one of precharged to a first voltage and discharged;

a reference cell having the first capacitance;

an even column coupled to the memory cell;

an odd column coupled to the reference cell;

a comparator having a first input coupled to the even column, a second input coupled to the odd column, and an output that provides a signal indicative a state of the memory cell; and control circuitry that charges the reference cell to a second voltage, the second voltage being substantially equal to half of the first voltage, wherein the control circuitry includes:

a control element that is initially discharged;

a precharged element that is precharged to the first voltage; and coupling circuitry that couples the precharged element to the control element so that the control element charges to the second voltage, the reference cell being adapted to follow the control element so that the reference cell charges to the second voltage.

9. The memory circuit of claim 8, wherein the control circuitry further includes a transistor interconnected between the control element and ground, that discharges the control element.

10. A memory circuit, comprising:

a memory cell having a first capacitance, and that is one of precharged to a first voltage and discharged;

a reference cell having the first capacitance;

an even column coupled to the memory cell;

an odd column coupled to the reference cell;

a comparator having a first input coupled to the even column, a second input coupled to the odd column, and an output that provides a signal indicative a state of the memory cell; and control circuitry that charges the reference cell to a second voltage, the second voltage being substantially equal to half of the first voltage, wherein the even column and the odd column are precharged to the first voltage, wherein the odd column adjusts to a third voltage when the reference cell is activated, wherein the even column is maintained at the first voltage when the memory cell is set to a first state and is activated, and wherein the even column adjusts to a fourth voltage when the memory cell is set to a second state and is activated, the third voltage being lower than the first voltage, the fourth voltage being lower than the third voltage.

11. The memory circuit of claim 10, further comprising:

a transistor interconnected between the reference cell and ground, that discharges the reference cell.

12. A memory circuit, comprising:

a memory cell having a first capacitance, and that is one of precharged to a first voltage and discharged;

a reference cell having the first capacitance;

an even column coupled to the memory cell;

an odd column coupled to the reference cell;

a comparator having a first input coupled to the even column, a second input coupled to the odd column, and an output that provides a signal indicative a state of the memory cell;

control circuitry that charges the reference cell to a second voltage, the second voltage being substantially equal to half of the first voltage; and a transistor interconnected between the reference cell and ground, that discharges the reference cell.

13. A memory circuit, comprising:

a memory cell having a first capacitance, and that is one of precharged to a first voltage and discharged:

a reference cell having the first capacitance;

an even column coupled to the memory cell;

an odd column coupled to the reference cell;

a comparator having a first input coupled to the even column, a second input coupled to the odd column, and an output that provides a signal indicative a state of the memory cell; and control means for charging the reference cell to a second voltage, the second voltage being substantially equal to half of the first voltage, wherein the control means includes:

a control element that is initially discharged;

a precharged element that is precharged to the first voltage; and means for coupling the precharged element to the control element so that the control element charges to the second voltage, the reference cell being adapted to follow the control element so that the reference cell charges to the second voltage.

14. The memory circuit of claim 13, wherein the control means further includes a transistor interconnected between the control element and ground, that discharges the control element.

15. A memory circuit, comprising:

a memory cell having a first capacitance, and that is one of precharged to a first voltage and discharged;

a reference cell having the first capacitance:

an even column coupled to the memory cell;

an odd column coupled to the reference cell:

a comparator having a first input coupled to the even column, a second input coupled to the odd column, and an output that provides a signal indicative a state of the memory cell; and control means for charging the reference cell to a second voltage, the second voltage being substantially equal to half of the first voltage, wherein the even column and the odd column are precharged to the first voltage, wherein the odd column adjusts to a third voltage when the reference cell is activated, wherein the even column is maintained at the first voltage when the memory cell is set to a first state and is activated, and wherein the even column adjusts to a fourth voltage when the memory cell is set to a second state and is activated, the third voltage being lower than the first voltage, the fourth voltage being lower than the third voltage.

16. The memory circuit of claim 15, further comprising:

a transistor interconnected between the reference cell and ground, that discharges the reference cell.

17. A memory circuit, comprising:

a memory cell having a first capacitance, and that is one of precharged to a first voltage and discharged;

a reference cell having the first capacitance;

an even column coupled to the memory cell;

an odd column coupled to the reference cell;

a comparator having a first input coupled to the even column, a second input coupled to the odd column, and an output that provides a signal indicative a state of the memory cell;

control means for charging the reference cell to a second voltage, the second voltage being substantially equal to half of the first voltage; and a transistor interconnected between the reference cell and ground, that discharges the reference cell.

18. A method for determining a state of a memory cell of a memory circuit including a reference cell, an even column coupled to the memory cell, an odd column coupled to the reference cell, and a comparator having a first input coupled to the even column, a second input coupled to the odd column, .and an output that provides a signal indicative of the state of the memory cell, wherein the reference cell is adapted to match the voltage of a control element, the method comprising the steps of:

charging the even column and the odd column to a first voltage;

charging the reference cell to a second voltage, the second voltage being substantially equal to the half of the first voltage, wherein the step of charging the reference cell to the second voltage includes the steps of:

discharging the control element;

charging a precharge element to the first voltage;

coupling the precharge element to the control element so that the control element charges to the second voltage and the reference cell charges to the second voltage to match the control element; and activating the memory cell and the reference cell to enable charges on the columns and cells to adjust and to enable the output of the comparator to provide the signal.

19. The method of claim 18, wherein a transistor is interconnected between the control element and ground, and wherein the step of discharging the control element includes the step of activating the transistor.

20. The method of claim 18, wherein the control element has a capacitance substantially equal to a capacitance of the precharge element, and wherein the step of coupling includes the step of:

moving an amount of charge from the precharge element to the control element which is substantially equal to an amount of charge maintained on the precharge element.

21. A method for determining a state of a memory cell of a memory circuit including a reference cell, an even column coupled to the memory cell, an odd column coupled to the reference cell, and a comparator having a first input coupled to the even column, a second input coupled to the odd column, and an output that provides a signal indicative of the state of the memory cell, the method comprising the steps of:

charging the even column and the odd column to a first voltage;

charging the reference cell to a second voltage, .the second voltage being substantially equal to the half of the first voltage; and activating the memory cell and the reference cell to enable charges on the columns and cells to adjust and to enable the output of the comparator to provide the signal, wherein the step of activating the memory cell and the reference cell includes the steps of:

electrically connecting the reference cell to the odd column so that the reference cell adjusts to a third voltage; and electrically connecting the memory cell to the even column so that the memory cell maintains the first voltage if the memory cell is set to a first state, and adjusts to a fourth voltage if the memory cell is set to a second state, the third voltage being lower than the first voltage, the fourth voltage being lower than the third voltage.

22. The method of claim 21, further comprising a step of:

discharging the reference cell before the step of charging the reference cell to the second voltage.

23. A method for determining a state of a memory cell of a memory circuit including a reference cell; an even column coupled to the memory cell; an odd column coupled to the reference cell; a comparator having a first input coupled to the even column, a second input coupled to the odd column, and an output that provides a signal indicative of the state of the memory cell; and a transistor interconnected between the reference cell and ground, the method comprising the steps of:

charging the even column and the odd column to a first voltage;

activating the transistor to discharge the reference cell;

charging the reference cell to a second voltage after the step of activating the transistor, the second voltage being substantially equal to the half of the first voltage; and activating the memory cell and the reference cell to enable charges on the columns and cells to adjust and to enable the output of the comparator to provide the signal.

* * * * *